United States Patent
Woo et al.

(10) Patent No.: US 8,184,471 B2
(45) Date of Patent: May 22, 2012

(54) DRAM HAVING STACKED CAPACITORS OF DIFFERENT CAPACITANCES

(75) Inventors: Dong-Soo Woo, Seoul (KR); Jong-Soo Kim, Incheon (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 543 days.

(21) Appl. No.: 12/416,722

(22) Filed: Apr. 1, 2009

(65) Prior Publication Data

US 2010/0081395 A1 Apr. 1, 2010

(30) Foreign Application Priority Data

Jul. 9, 2008 (KR) .................. 10-2008-0066745

(51) Int. Cl.
*G11C 11/24* (2006.01)
(52) U.S. Cl. .............. 365/149; 365/63; 365/230.03
(58) Field of Classification Search .............. 365/63, 365/145, 149, 189.07, 189.09, 205, 230.03; 257/621, 646
See application file for complete search history.

(56) References Cited

U.S. PATENT DOCUMENTS

| | | | | |
|---|---|---|---|---|
| 5,371,699 A | * | 12/1994 | Larson | 365/145 |
| 6,052,324 A | * | 4/2000 | Tobita | 365/207 |
| 6,282,145 B1 | * | 8/2001 | Tran et al. | 365/230.06 |
| 6,333,530 B1 | | 12/2001 | Itou | |
| 6,781,915 B2 | * | 8/2004 | Arimoto et al. | 365/230.03 |
| 6,965,531 B2 | * | 11/2005 | Mine | 365/189.07 |

FOREIGN PATENT DOCUMENTS

| | | |
|---|---|---|
| JP | 2001-036033 | 2/2001 |
| JP | 2003-100080 | 4/2003 |
| KR | 1020010014942 | 2/2001 |
| KR | 1020010060730 | 7/2001 |

* cited by examiner

*Primary Examiner* — Gene Auduong
(74) *Attorney, Agent, or Firm* — F. Chau & Associates, LLC

(57) ABSTRACT

A DRAM device having a plurality of memory blocks, including edge-located memory blocks and adjacent central memory blocks. An edge-located memory block shares a sense amplifier with an adjacent central memory block. The memory cells in the edge-located memory block include data storage capacitors having a greater capacitance value than data storage capacitors in the memory cells in the adjacent central memory block. The data storage capacitors in edge-located memory cells may have greater surface area than data storage capacitors in the central memory cells. The data storage capacitors in edge-located memory cells may be formed by connecting in parallel two data storage capacitors of the shape and size of data storage capacitors used in each of the memory cells of the adjacent central memory block.

28 Claims, 10 Drawing Sheets

US 8,184,471 B2

DRAM HAVING STACKED CAPACITORS OF DIFFERENT CAPACITANCES

CROSS-REFERENCE TO RELATED APPLICATION

This application claims priority to and the benefit of Korean Patent Application No. 10-2008-0066745 filed in the Korean Intellectual Property Office on Jul. 9, 2008, the entire contents of which are incorporated by reference herein.

BACKGROUND

1. Technical Field

This disclosure relates to semiconductor memory devices, and more particularly, to a dynamic random access memory (DRAM) array including different data storage capacitor structures.

2. Discussion of the Related Art

In a memory cell array of a conventional dynamic random access memory (DRAM) device, each memory cell includes a semiconductor switch and a data storage capacitor.

A metal-oxide-semiconductor (MOS) type dynamic random access memory (DRAM) has a memory cell comprising one field effect transistor (FET), having a metal oxide gate dielectric, serving as an access switch and one capacitor connected thereto serving as the data storage element. Manufacturers of DRAM devices endeavor to achieve high integration and high speed response, by reducing the size of each memory cell. An adequate capacitance of the data storage capacitor must be maintained for maintaining a proper charge storage retention period, which is a maximum time that the charge is maintained on the storage node before a refresh operation is required. Since the capacitance of the DRAM's data storage capacitor is proportional to a data storage capacitor electrode's surface area, there is a continual balance between the size of the data memory cell and the refresh rate.

Data storage capacitors in DRAM memory cells tend to leak charge, and thus need to be periodically refreshed (read and re-written). Reducing the size of each cell capacitor results in a decrease in the amount of charge stored in the capacitor, which affects the frequency and reliability of refresh operations. A decrease in the amount of charge can result in soft errors that may alter the content of the memory cell.

Each memory cell in a DRAM may have an 8F2 configuration, F being the feature size based on a semiconductor fabrication design rule, wherein the active regions comprising the switching transistors are typically elongated perpendicular to the word lines. Efforts to improve the integration of semiconductor devices, and particularly to reduce the area occupied by each memory cell in a memory cell array, have produced memory cells having 6F2 configurations. Elongated (e.g., bar-shaped) active regions each comprising two switching transistors of a 6F2-type DRAM are formed diagonally relative to the bit lines and the word lines. A portion of a conventional 6F2-type memory cell block having diagonal active regions is illustrated in FIG. 1.

FIG. 1 is a top plan view of a representative portion of a conventional 6F2-type memory block formed at the edge of a memory region of an integrated circuit. As shown, on the surface of a semiconductor substrate are formed a plurality of word lines 220 which run parallel with one another in rows. Also formed on the substrate are a plurality of bit lines 230 (230r and 230d) which run parallel with one another in columns. A plurality of memory cells (MC) are formed at the respective intersections of the word lines 220 and the bit lines 230. Each memory cell comprises one access transistor formed in an active semiconductor region 210 (210r & 210d) on the substrate and one data storage capacitor 140 (140r or 140d). The data storage capacitor 140 (140r & 140d) stores an electric charge representing a bi-stable memory state. Each access transistor comprises a source region electrically connected to a bit line 230 and a drain region electrically connected to a word line 220, formed in an active region 140 (140r or 140d) of the semiconductor substrate, and a gate electrode connected to a portion of word line 220 formed between the source/drain regions. The access transistor serves as a switch for controlling the charging and discharging of the data storage capacitor 210 (210r & 210d) as well as reading and writing of the logic states into the capacitor, i.e., by charging or discharging the capacitor. The two word lines 220 crossing each active region also serve as the corresponding gate electrodes of the two access transistors of two memory cells of each active region.

Adjacent diagonal active regions of different bit-lines (columns) may be arranged with end to end alignment in the major (longer) axis direction. Alternatively, as illustrated in FIG. 1, the active region-to-active region distance between adjacent active regions of different bit-lines (columns) may be narrower than the feature size F, while the active region-to-active region distance between adjacent active regions of the same bit-line (column) may be the same as, less than, or wider than the feature size F. This compaction results in higher integration and smaller memory region size.

The data storage capacitors 140r correspond to access transistors connected to active bit lines 230r that are connected to sense amplifiers (S/A) 65, and thus are readable. The other data storage capacitors 140d correspond to access transistors of "dummy memory cells" connected to "dummy bit lines" 230d that are not connected to any sense amplifiers (S/A) 65, and thus are unable to be read-out any stored data.

The fabrication of semiconductor memory devices typically includes the depositing and patterning of layers. In general, the fabrication of a device can start with the patterning of a portion of the semiconductor substrate into active area regions separated from one another by insulation. Subsequent alternating insulation and conductive layers are then formed over, and sometimes coupled to the substrate, to create and interconnect various circuit elements, such as access transistors, data storage capacitors and the like. The "dummy" data storage capacitors 140d and "dummy" transistors in dummy active regions 210d and "dummy bit lines" 230d and their interconnections are formed when the same lithography patterns are used to form the memory blocks on the edge of a memory region as are used to form the memory blocks in the interior of a memory region. As illustrated in FIG. 7, adjacent memory blocks in a memory region of an integrated circuit may share a sense amplifier S/A 65. Odd bit lines of a given memory block may be connected to the sense amplifier S/A 65 shared with the memory block on the left, while even bit lines of the given memory block may be connected to the sense amplifier S/A 65 shared with the memory block on the right side. Thus a centrally located memory block having two adjacent memory blocks in the bit line (column) direction will be served by two sense amplifiers S/A 65, but an "edge" located memory block having only one adjacent memory block in the bit line (column) direction will be served by only sense amplifiers S/A 65. Thus every other bit line, for example, the even bit lines 230d, may not be connected to any sense amplifier S/A 65. These unconnected bit lines are referred to as "dummy bit lines", and the corresponding data storage capacitors 140d connected thereto are referred to as "dummy capacitors". The dummy capacitors are conventionally formed in a memory block located at the edge of a memory region of an integrated circuit conventionally serve no remarkable function.

SUMMARY

According to an aspect of the present invention, memory devices having a plurality of memory blocks may include edge-located memory blocks and adjacent central memory blocks that share sense amplifiers. An edge-located memory block sharing a sense amplifier with an adjacent central memory block may contain "dummy" data storage capacitors, with corresponding "dummy bit lines", dummy active regions, and dummy vertical contacts therebetween. An aspect of the present invention provides memory cells in edge-located memory blocks that include data storage capacitors having a greater capacitance value than data storage capacitors in the memory cells in the adjacent central memory block sharing the same sense amplifier S/A. The data storage capacitors used in edge-located memory cells may have greater surface area and greater capacitance values than data storage capacitors in the central memory cells. The data storage capacitors in edge-located memory cells may be formed by connecting in parallel two data storage capacitors of the shape and size of data storage capacitors used in each of the memory cells of the adjacent central memory block. One of these two storage capacitors in an edge-located memory block would have, but for the teachings disclosed herein, been a "dummy" data storage capacitor. The memory cells may be dynamic random access memory (DRAM) cells.

Some exemplary embodiments of the invention provide semiconductor memory device comprising: a first memory cell block including a first plurality of word lines, a first plurality of bit lines, and a first plurality of memory cells formed on a substrate; a second memory cell block, adjacent to the first memory cell block, including a second plurality of word lines, a second plurality of bit lines, and a second plurality of memory cells on the substrate; and a first sense amplifier, positioned between the first and second memory cell blocks and connected to the first plurality of memory cells by a first one of the first plurality of bit lines and connected to the second plurality of memory cells by a first one of the second plurality of bit lines, configured to sense data stored in each of the first plurality of memory cells and in each of the second plurality of memory cells, wherein each memory cell among the first plurality of memory cells includes a data storage capacitor having a first capacitance value, and wherein each memory cell among the second plurality of memory cells includes a data storage capacitor having a second capacitance value. The first capacitance value is substantially greater than the second capacitance value, and may be equal to, greater than, or less than two times the second capacitance value. The first memory cell block may be positioned along an edge of a memory region on the substrate, while the second memory cell block is not positioned along that edge of a memory region on the substrate.

The data storage capacitor of each memory cell among the first plurality of memory cells may occupy substantially more surface area on the substrate than the surface area on the substrate occupied by the data storage capacitor of each memory cell among the second plurality of memory cells.

Each memory cell among the first and second pluralities of memory cells may further include an access transistor connected between a bit line and its data storage capacitor, and each access transistor is controlled by a word line. Two of the access transistors of the memory cells may be formed in one elongated active region having a long axis and a short axis perpendicular to the long axis, and two of the word lines, and in some embodiments of the invention, the long axis of each elongated active region of memory cells among the second plurality of memory cells is diagonal relative to the direction of the word lines. In such embodiments, the long axis of each elongated active region of memory cells among the first plurality of memory cells may or may not be diagonal relative to the direction of the word lines.

In some embodiments, each data storage capacitor of the first plurality of memory cells may comprise: a first stacked capacitor having the second capacitance value; a second stacked capacitor also having the second capacitance value; and a conductor connecting the first stacked capacitor in parallel with the second stacked capacitor and connecting to a vertical contact connected to the access transistor of its corresponding memory cell among the first plurality of memory cells.

In some embodiments, each data storage capacitor of the first plurality of memory cell may comprise: a first stacked capacitor having the first capacitance value; and a first conductive pad connecting the first stacked capacitor to a vertical contact connected to the access transistor of its corresponding memory cell among the first plurality of memory cells.

Another aspect of the invention provides a method comprising: forming a first plurality of active regions in a first memory cell block, along an edge of a memory region, forming a second plurality of active regions in a second memory cell block, not along the edge of the memory region, forming a third plurality of active regions in the second memory cell block; forming a first bit line for connecting all of the first plurality of active regions to a first sense amplifier located between the first and second memory cell blocks, forming a second bit line for connecting all of the second plurality of active regions to the first sense amplifier, and forming a third bit line adjacent to the second bit line for connecting all of the third plurality of active regions to a second sense amplifier not located between the first and second memory cell blocks; forming a plurality of first data storage capacitors, each second data storage capacitor having a first capacitance value and being connected to one respective memory cell among the first plurality of memory cells; forming a plurality of second data storage capacitors, each second data storage capacitor having a second capacitance value and being connected to one respective memory cell among the second plurality of memory cells; forming a plurality of third data storage capacitors, each third data storage capacitor having the second capacitance value and being connected to one respective memory cell among the third plurality of memory cells. The first capacitance value is greater than the second capacitance value. The first capacitance value may be less than, equal to, or greater than the two times the second capacitance value. Each of the memory cells may be dynamic random access memory (DRAM) cells.

Forming the pluralities of first, second and third data storage capacitors may comprise: forming a plurality of first stacked capacitors having the second capacitance value in first memory cell block and in the second memory cell block; forming a plurality of second stacked capacitors also having the second capacitance value adjacent to the plurality of first stacked capacitors in first memory cell block and in second memory cell block; forming a plurality of conductive links within first memory cell block for connecting each one of the first stacked capacitors formed within first memory cell block to a corresponding one of the second stacked capacitors formed within first memory cell block, wherein first stacked capacitors formed within second memory cell block are the plurality of second data storage capacitors, and wherein second stacked capacitors formed within second memory cell block are the plurality of third data storage capacitors.

Each one of the plurality of first data storage capacitors may comprise: a first stacked capacitor having the second capacitance value; a second stacked capacitor also having the second capacitance value; and a conductor connecting the first stacked capacitor in parallel with the second stacked capacitor and connecting to a vertical contact connected to the access transistor of its corresponding memory cell among the first plurality of memory cells.

In some embodiments, each active regions formed in first memory and second memory cell blocks may have a major axis and a minor axis, wherein the major axis is diagonal relative to the word lines. In other embodiments, while active regions formed in the second memory cell block may have a major axis and a minor axis, wherein the major axis is diagonal relative to the word lines, the active regions formed in the first memory cell block are not diagonal relative to the word lines.

DETAILED DESCRIPTION OF EXEMPLARY EMBODIMENTS

Figure 1:
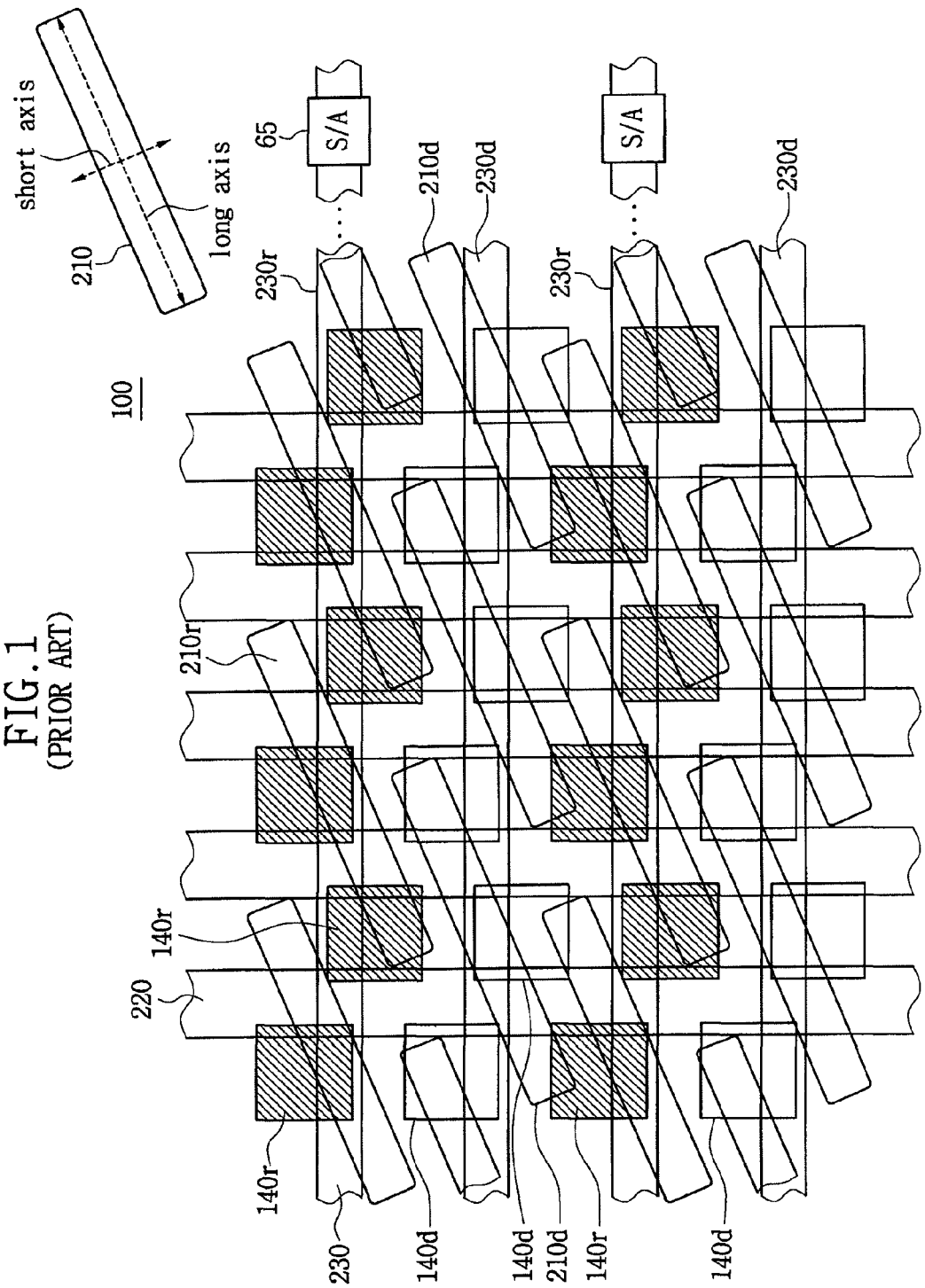
FIG. 1 is a top plan view of a portion of a conventional 6F2-type memory cell block formed at an edge of a memory region.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like numbers refer to like elements throughout.

It will be understood that when an element is referred to as being "coupled", "connected", to another element, it can be directly coupled, connected to the other element or intervening elements may be present.

It also will be understood that, as used herein, the terms "row" or "horizontal" and "column" or "vertical" indicate two relative non-parallel directions that may be orthogonal to one another. However, these terms do not require an absolute horizontal or vertical orientation as shown in the figures.

Spatially relative terms, such as "beneath", "below", "lower", "on", "above", "upper", "over" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the relative term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. The term "a capacitor" includes the equivalent capacitance $C_{eq}$ of a plurality of capacitors C1, C2 connected in parallel by a conductor: $C_{eq}=C1+C2$.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. The shapes of data storage capacitors herein may be varied from the shapes of the illustrations. Thus, embodiments of the invention should not be construed as limited to the particular shapes of regions illustrated herein but are to include deviations in shapes that result, for example, from manufacturing or design choices. Thus, the regions illustrated in the figures are schematic in nature and their shapes are not intended to illustrate the actual shape of a region of a device and are not intended to limit the scope of the invention. It will be understood, for example, that a rectangular feature may have rounded corners.

Figure 2A:
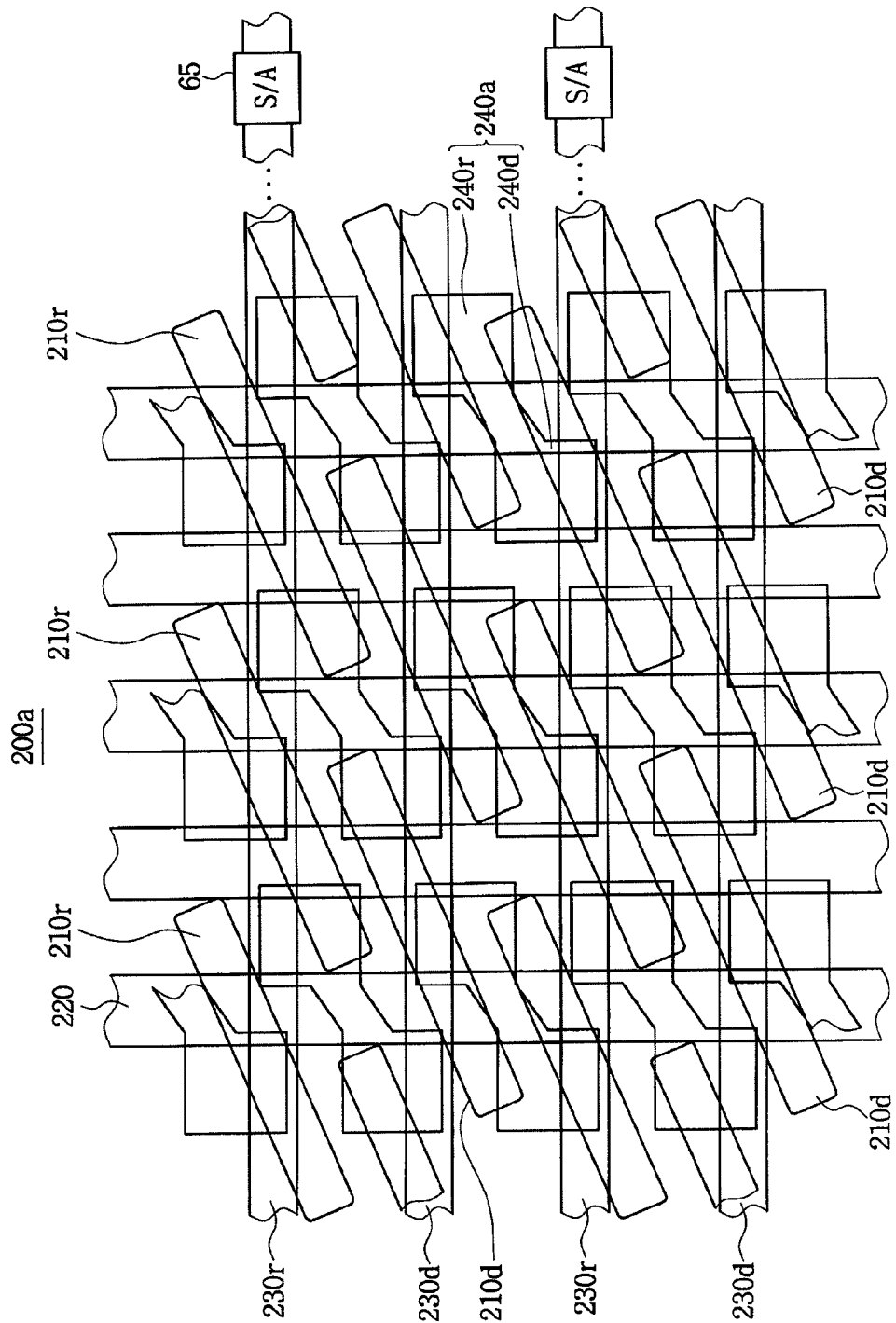
FIG. 2a is a top plan view of a portion of a 6F2-type memory block formed at an edge of a memory region according to a first exemplary embodiment of the invention.

FIG. 2a is a top plan view of a representative portion 200a of a 6F2-type memory block formed at the edge of a memory region (see, e.g., 10a in FIG. 7) of an integrated circuit, according to an exemplary embodiment of the invention. As shown in FIG. 2a, a memory block 200a formed at the edge of a memory region on the surface of a semiconductor substrate includes a plurality of word lines 220 that run parallel with one another in rows and a plurality of bit lines 230 (230r and 230d) which run parallel with one another in columns. The memory cell structure in edge memory block illustrated in FIG. 2a may be configured the same as for memory block 1 as in FIG. 1, except that the functioning data storage capacitors 240a connected to sense amplifier S/A 65 are different in capacitance from the that in the conventional edge memory block 100 in FIG. 1. The functioning data storage capacitors 240a is made up of a combination of readable data storage capacitors 240r and "dummy" storage capacitors 240d. The storage capacitors 240a are connected to sense amplifier S/A 65 through access transistors formed in the active regions 210r connected to bit lines 230r.

Figure 4:
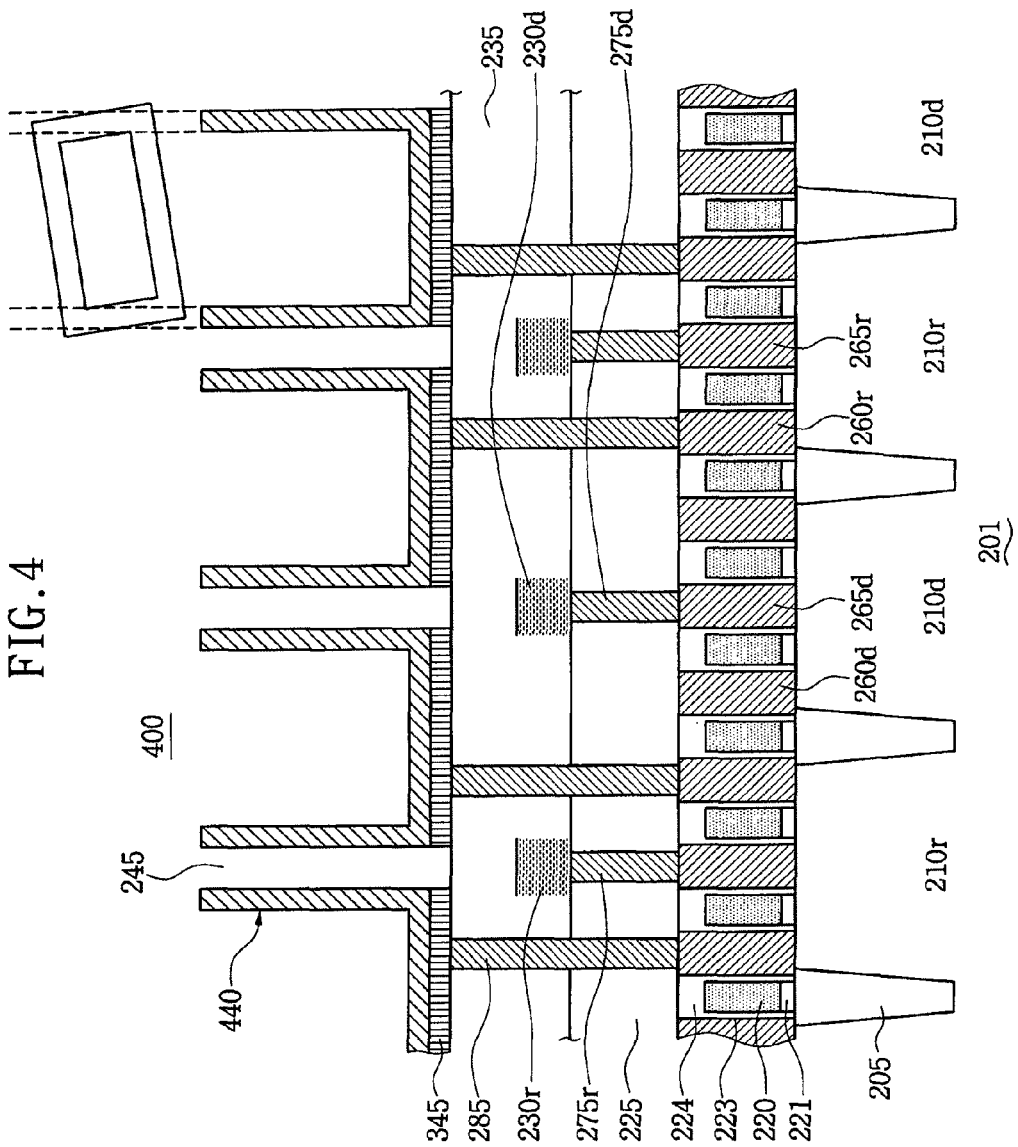
FIG. 4 is a cross-sectional view of a portion of a second exemplary edge-located memory block 400 formed according to the plan view shown in FIG. 2a, the section line being approximately parallel with the major axis of active regions 210r and 210d formed therein.
Figure 7:
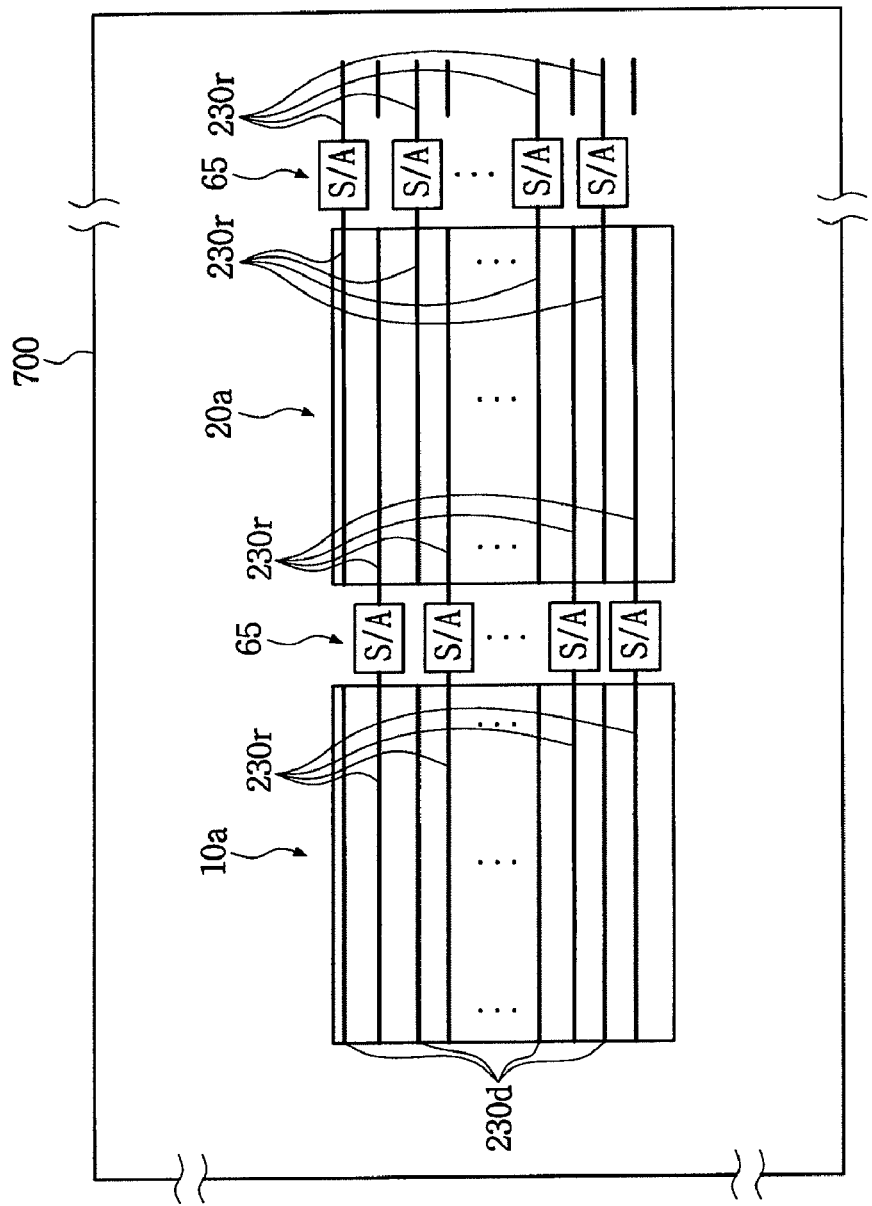
FIG. 7 is a block diagram of an integrated circuit according to an exemplary embodiment of the patent invention.

In alternative embodiments, referring to FIGS. 2a, 4, and 7, the plurality of "dummy bit lines" 230d may be partially or entirely omitted from an edge memory block of an integrated circuit; and the plurality of "dummy" contacts 260d, 265d, and 275d may be partially or entirely omitted from an edge memory block of an integrated circuit. In still further alternative embodiments, some of the STIs 205 may be partially or entirely omitted from an edge memory block of an integrated circuit. Thus, in alternative embodiments, the shapes, sizes, and positions of the active regions 210r, and/or of contacts 260r, 265r, 275r, and 285 may be different in edge memory blocks while the corresponding same elements of an adjacent central memory block (e.g., 20a in memory region of an integrated circuit 700 in FIG. 7) will remain as shown in FIG. 2a.

Referring again to FIG. 2a, a plurality of memory cells (MC) are formed at the respective intersections of the word lines 220 and the bit lines 230r. Each memory cell of FIG. 2a comprises one access transistor formed in an active semiconductor region 210r on the substrate and a functioning data storage capacitor 240a. The data storage capacitor 240a stores an electric charge representing a bi-stable memory state.

The data storage capacitors 240r are connected to access transistors connected to active bit lines 230r that are connected to sense amplifiers (S/A) 65, and thus are readable. As shown in FIG. 7, adjacent memory blocks in a memory region of an integrated circuit may share a sense amplifier S/A 65. An odd bit line 230r of an edge memory block 10a may be connected to the same sense amplifier S/A 65 that is also connected to an odd bit line of an adjacent central memory block 20a.

In the edge memory block of FIG. 2a, the data storage capacitors 240a are connected to sense amplifiers 65 through access transistors and through bit lines. Each data storage capacitor 240a is made up of two capacitors, to 240r and 240d, which are connected in parallel via a conductor (e.g., pad 345) to function as one larger capacitor 240a having a total capacitance $C_{eq}$ equal to the additive sum of the capacitance $C_{240r}$ of the first capacitor 240r plus the capacitance $C_{240d}$ of the second capacitor 240d. Thus, in an edge memory block, each functioning data storage capacitor 240a corresponding to an access transistor in an active region 210r and connected to a sense amp S/A 65 through a bit line 230r, is a combination of a capacitor 240d and a capacitor 240d. Meanwhile, in an adjacent memory block (e.g., 20a in FIG. 7) having its own bit lines 230r sharing the same sense amplifier S/A 65, each functioning data storage capacitor 240a connected to the same sense amplifier S/A 65 will be essentially only a capacitor 240d. This is because such an adjacent memory block 20a would not contain any "dummy" capacitors 240d to be combined with a capacitor 240d. Since each capacitor 240d in either memory blocks 10a and 20a in FIG. 7 may be identically formed having the same capacitance C, the "data storage capacitor" 240a of an edge memory block 10a will have a capacitance equal to 2C, while the data storage capacitor 240r of a centrally located memory block 20a will have a capacitance equal to C. Thus, a DRAM memory cells shown in FIG. 2a in an edge memory block according to an embodiment of the present invention have a greater capacitance than the conventional DRAM memory cells shown in FIG. 1 in a conventional edge memory block. With the increased storage capacitance, the frequency of refresh operations can be decreased and the overall reliability of the memory device is increased, and the occurrence of soft errors that may alter the content of the memory cell may be decreased.

In an alternative embodiment according to the present invention, in each memory cell in an edge memory block, each functional data storage capacitor 240a comprises one merged capacitor occupying at least the footprints of both of the conventional data storage capacitor electrodes 140r and 140d shown in FIG. 1. In this embodiment, there is no need for further interconnection by an additional conductive element, e.g., a storage node pad 345.

In the edge memory block of FIG. 2a, the footprints of the functional data storage capacitors 240a overlap and are elongated in a direction substantially parallel with the major (long) axis of the underlying active regions 210r and 210d. For example, the sharp angles of the footprint of each data storage capacitor 240a may be rounded. Or, the footprint of each data storage capacitor 240a may be a simple elongated shape such as a rectangle.

Figure 2B:
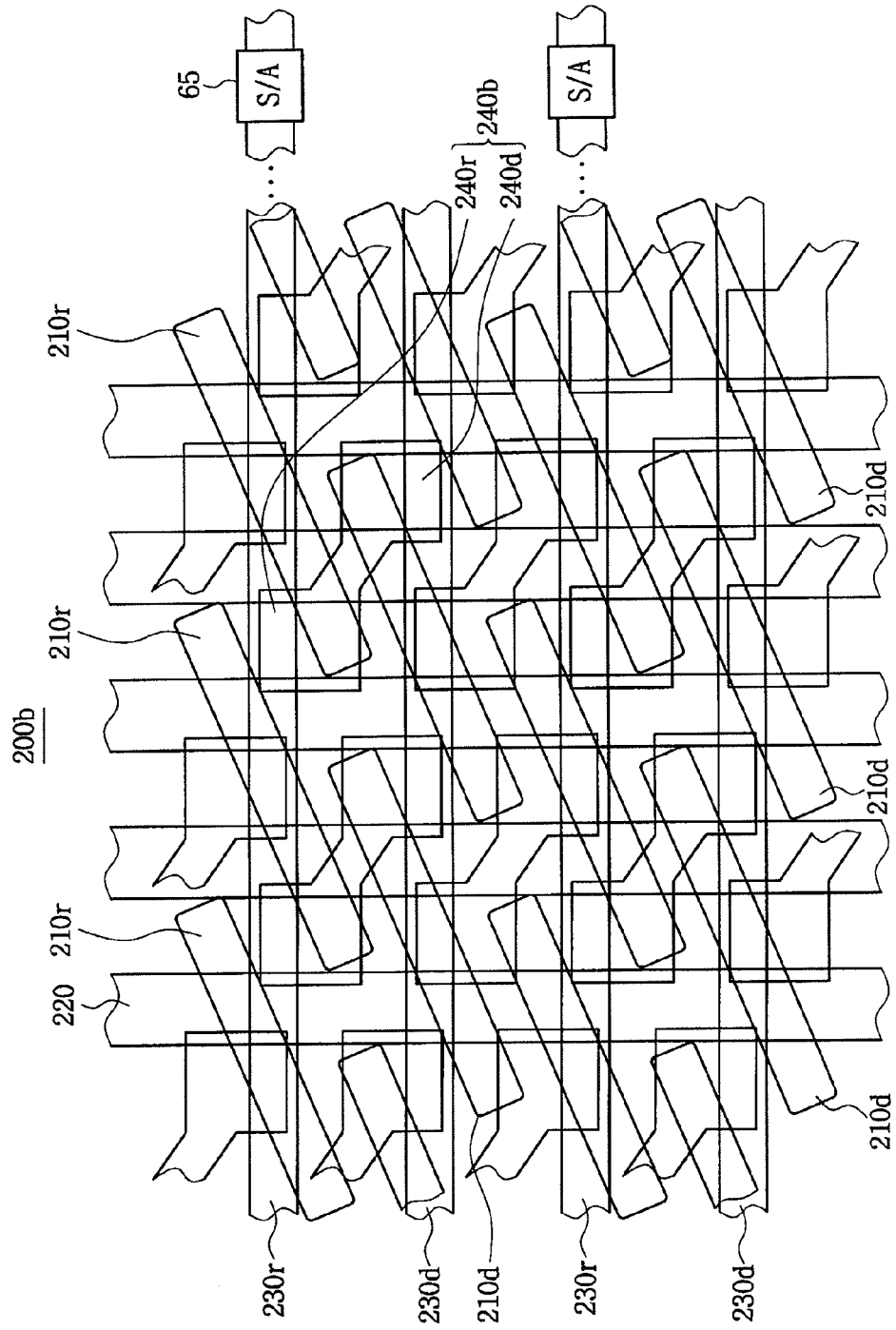
FIG. 2b is a top plan view of a portion of a 6F2-type memory block formed at an edge of a memory region according to another exemplary embodiment of the invention.

FIG. 2b is a top plan view of a representative portion 200b of a 6F2-type memory block formed at the edge of a memory region of an integrated circuit, according to an exemplary embodiment of the invention. The edge-located memory block of FIG. 2b, is similar to the edge-located memory block of FIG. 2a except that the footprint of each functional data storage capacitor 240b overlaps and is elongated in a direction substantially perpendicular to the major (long) axis of the underlying active regions 210r and 210d. This difference is a result of a different selection of neighboring "dummy" storage capacitors 240d to be connected to or merged with neighboring data storage capacitors 240r.

The footprint of the functional data storage capacitor 240a as shown in FIG. 2b reflects the need to separate the electrode(s) of one functional data storage capacitor 240a from the electrode(s) of an adjacent functional data storage capacitor 240a, so that adjacent functional data storage capacitors 240a will not be capacitively coupled and there will be no charge leakage between them. Various other footprint shapes and positioning between footprints of the functional data storage capacitors 240a are within the scope of the invention.

However, as previously explained, the underlying "dummy" memory cell elements, including the "dummy" bit lines, may be partially or completely omitted, and thus the shapes and footprints of the functional data storage capacitors 240b in an edge-located memory block may be designed without regard for the original positions of the underlying intersections of "dummy bit lines" 230d or of positions of dummy "active regions" 210d or of vertical contacts therebetween.

Each of FIG. 3, FIG. 4, FIG. 5, and FIG. 6 are cross-sectional views of semiconductor memory devices including DRAM cells according to exemplary embodiments of the present invention, the section line being approximately parallel with the major axis of active regions 210r and 210d shown in FIG. 2a.

As shown in each of FIG. 3, FIG. 4, FIG. 5 and FIG. 6, a shallow trench isolation, (STI) 205 may be formed on the substrate 201 to define the active regions 210r and 210d. Impurity doped source/drain regions of each access transistor are formed in each active region of the semiconductor substrate 201. A thin gate oxide layer 221 isolates the word line 220 from the active region 210r or 210d. Each access transistor may be a symmetrical or non-symmetrical device. Where an access transistor is symmetrical, its source and drain regions are essentially interchangeable. However, where an access transistor is a non-symmetrical device, the source or drain regions of access transistor have different electrical, physical, doping concentration and/or doping profile characteristics.

Word lines 220 cross over the active regions 210r and 210d and serve as gate electrodes of the access transistors. The word lines 220 have a predetermined width (e.g., feature width F) and are arranged in parallel having predetermined spacing from one another. The word line 220 may include a polysilicon layer, covered by an insulating capping layer 224. Insulating spacers 223 may be provided on sidewalls of the word lines 220.

The first planar interlayer dielectric comprised of insulating capping layer 224 and insulating spacers 223 formed over and on the sidewalls of the word lines 220 is patterned to provide self-aligned contact (SAC) holes between and on opposite sides of the word lines 210r and 210d, thereby exposing the access transistor source and drain regions. The self-aligned contact (SAC) holes may be filled with a conductive layer, polysilicon, to form source pads 260d and 260r and drain pads 265d and 265r correspond to each bit line 230. A second interlayer dielectric 225 may be formed on the structure including the source pads 260 and the drain pads 265. Bit lines 230d and 230r connect to the drain pads 265d and 265r via bit line contacts 275d and 275r. A third interlayer dielectric 235 may be formed on the bit lines 230 and on the second interlayer dielectric 225. Storage plugs 285 connect the source pads 260r to respective storage pads 345. Storage capacitor electrodes 240 are connected to an supported by the storage node pads 345.

Figure 3:
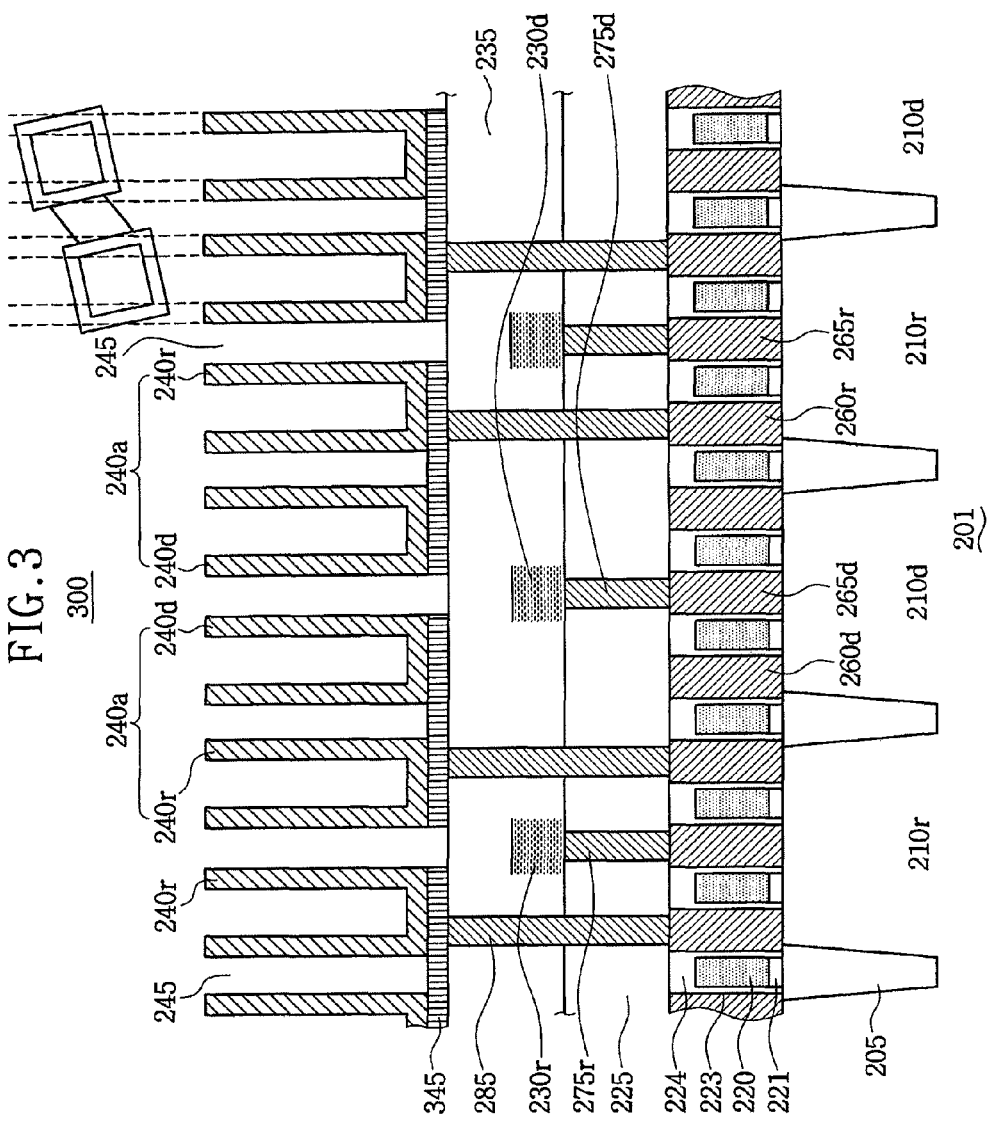
FIG. 3 is a cross-sectional view of a portion of an first exemplary edge-located memory block 300 formed according to the plan view shown in FIG. 2a, the section line being approximately parallel with the major axis of active regions 210r and 210d formed therein.
Figure 5:
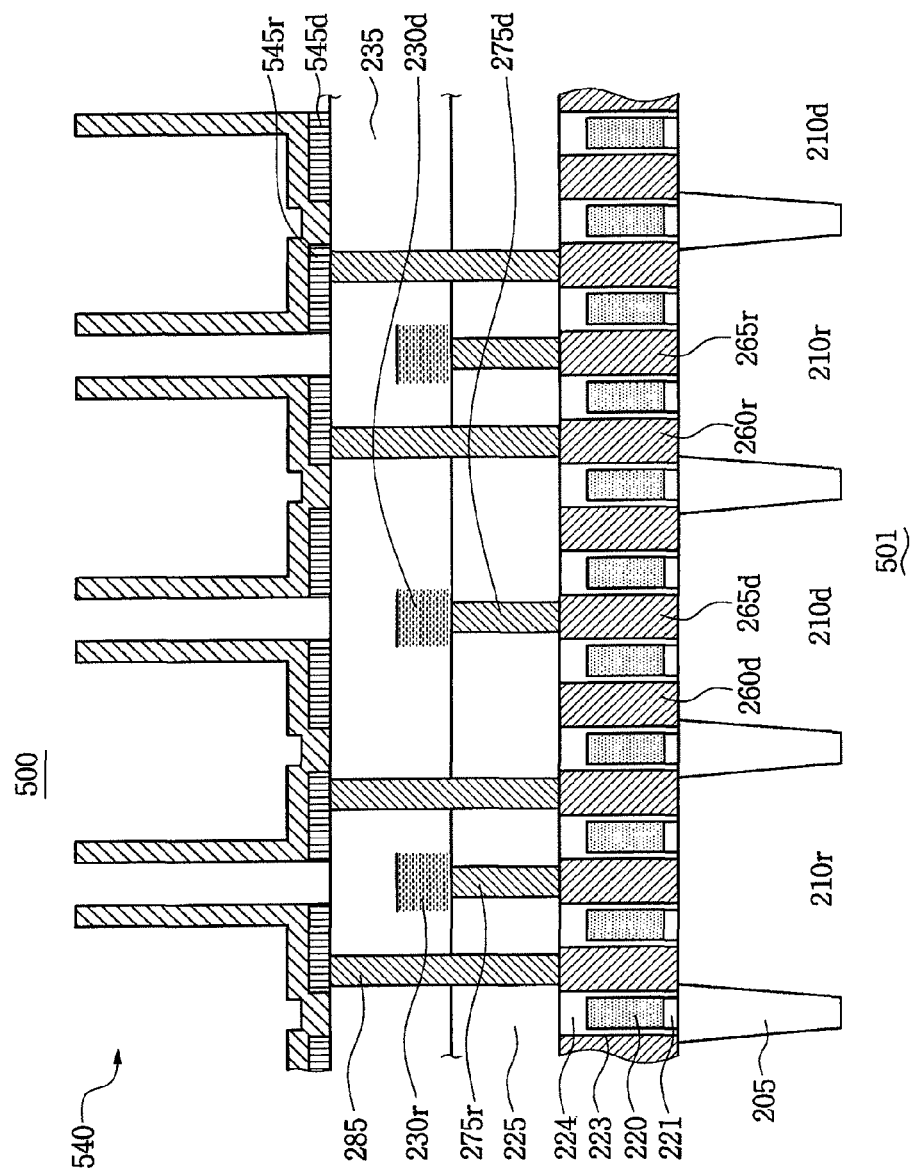
FIG. 5 is a cross-sectional view of a portion of a third exemplary edge-located memory block 500 formed according to the plan view shown in FIG. 2a, the section line being approximately parallel with the major axis of active regions 210r and 210d formed therein.
Figure 6:
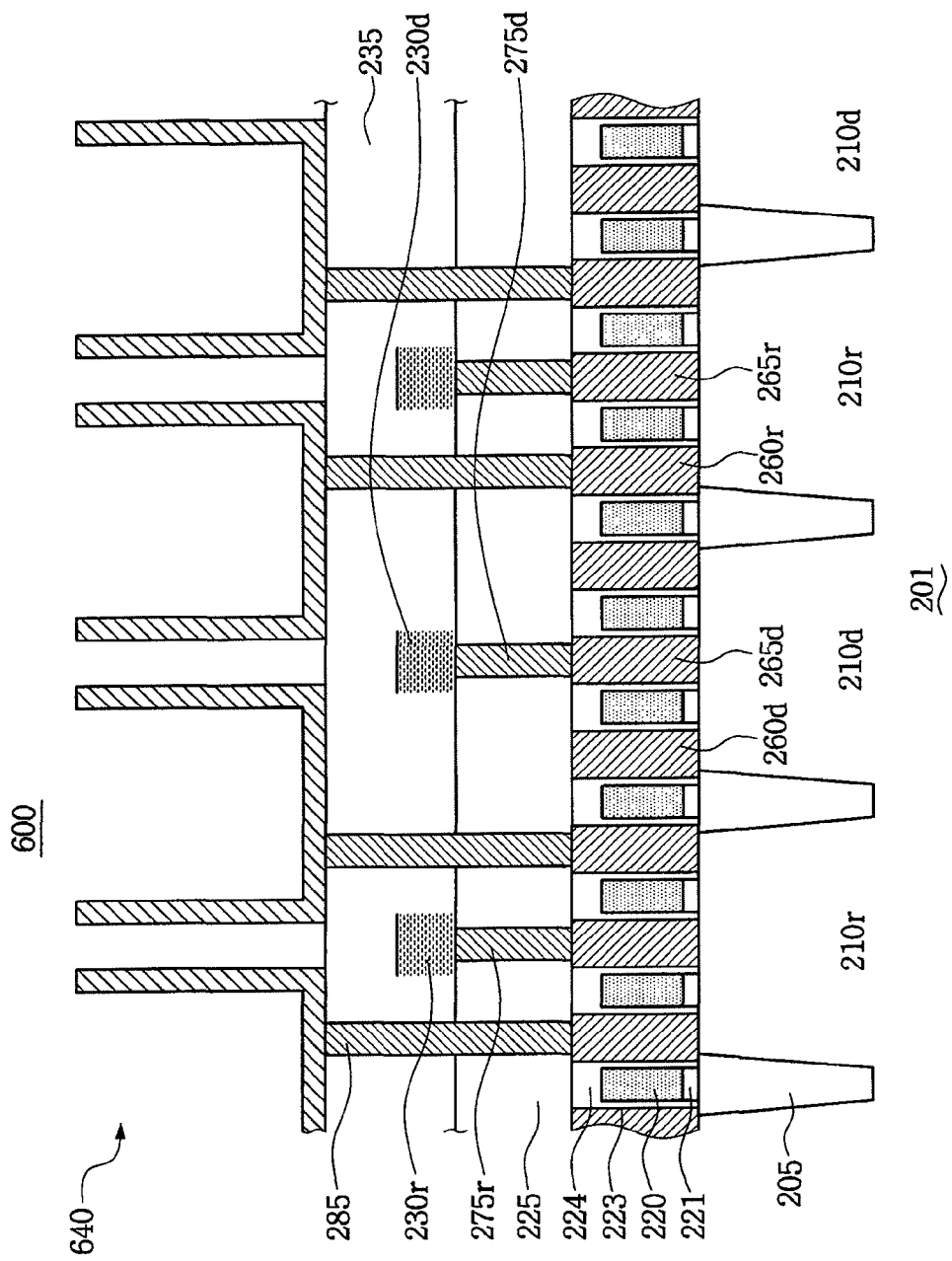
FIG. 6 is a cross-sectional view of a portion of a fourth exemplary edge-located memory block 600 formed according to the plan view shown in FIG. 2a, the section line being approximately parallel with the major axis of active regions 210r and 210d formed therein.

In each of FIG. 3, FIG. 4, and FIG. 5, the storage capacitor electrode (340, 440, 540) may partially extend over or overlap two or more word lines 220. Thus, the surface area of the substrate 201 occupied by a storage capacitor electrode (340, 440, 540) may extend beyond the area of the substrate occupied by the corresponding active region 265 (e.g., 265d, 265r) and over the area of the substrate occupied by the adjacent active region and word line 220, while maintaining a regular spacing with respect to storage capacitor electrodes (340, 440, 540) formed at another active region to increase the surface area of the storage electrodes.

FIG. 3, FIG. 4 and FIG. 5 illustrate exemplary embodiments of the present invention wherein storage capacitor electrodes 240, 440, and 540 are not in direct contact with storage plugs 285. As shown in FIG. 3, FIG. 4 and FIG. 5, storage node pads 345 and 545 may be formed directly on the storage plugs 285. The storage capacitor electrodes 240, 440, and 540 may be formed directly on respective storage node pads 345, 445 and 545, storage node pads allow the storage electrodes to be horizontally shifted relative to their corresponding access transistor sources in the active region without increasing the area of the storage capacitor electrodes, and to maintain a regular spacing with respect to adjacent storage electrodes of adjacent active regions.

The storage node pads may each be formed or extend partially over the adjacent word lines 220. Thus, the word lines 220 may be formed between portions the storage node pads and the substrate 201.

According to an exemplary embodiment of the present invention, the data storage capacitors in the DRAM memory cells shown in FIGS. 2-6 are formed as stacked capacitors. Each of FIGS. 2a and 2b illustrates a top view representation of a portion of a DRAM memory device including stacked capacitors 240r and 240d. Each of FIGS. 3 through 6 includes a cross-sectional representation of a stacked capacitor in a portion of a DRAM memory device. The data storage capacitors 340r and 340d, 440, 540, 640 are formed (stacked) above the memory cell access transistors formed in the active regions 210r and 210d on the semiconductor substrate 201.

After the memory cell access transistors are formed in the substrate 201, a second interlayer dielectric 225 is formed over the semiconductor substrate 210 and over word lines 220 by a suitable deposition technique such as chemical vapor deposition (CVD). A third interlayer dielectric 235 is then formed over the second interlayer dielectric 225 by a suitable deposition technique such as chemical vapor deposition (CVD). Contact holes or windows are formed through the insulating layers 225 and 235 to expose the SACs 260 electrically connected to the sources formed in the active regions. A conductive contact plug 285 is formed in each contact hole to electrically connect a data storage capacitor's electrode to the source of the access transistor and to enable the stacking of the capacitor's electrode over the word lines 220 and over the bit lines 230r and 230d. The contact plug 285 may be formed with a conductor such as polysilicon or metal (e.g., tungsten) using a CVD technique and then subsequently planarized by a chemical mechanical polishing (CMP) technique or by an etch back technique.

A fourth interlayer dielectric 245 is formed over the contact plugs 285 to serve as a sacrificial layer in the formation of the capacitor electrodes. This allows recessed areas formed according to an inlay pattern to be anisotropically etched into the insulating layer 245 until terminating at an etch stop layer (not shown). In the embodiments of the present invention as shown in FIGS. 3 and 4, a storage node pad 345 or 445 may also serve the function of an etch stop layer. In such cases, the inlay pattern may be aligned over the storage node pads 345 or 445 instead of over the contact plugs 285. In alternative embodiments, conductive pads may be formed between the first (224, 223) and second (225) interlayer dielectrics and/or between the second (225) and third (235) interlayer dielectrics (e.g., between the bit lines 230: 230d and 230r), and the inlay pattern may be aligned over these conductive pads, and contact plugs 285 may be formed between these conductive pads and the capacitor electrodes.

The contact plug 285 may be formed with a conductor such as polysilicon or metal (e.g., tungsten) using a CVD technique and then subsequently planarized by a chemical mechanical polishing (CMP) technique or by an etch back technique.

According to an alternative embodiment of the present invention, the inlay pattern may have any of square shapes, circular shapes, rectangular shapes, or other shapes.

Inlay openings are formed in the interlayer dielectric 245 down to the contact plugs 285 or down to storage node pads 345, 445 using the inlay pattern, such as by an anisotropic etch technique.

A conductive layer, for example polysilicon, is conformally deposited over the inlay openings in the interlayer dielectric 245 to a controlled thickness to form a coating of conductive layer in the inlay openings, thus forming the conductive capacitor electrodes (240, 340, 440, 540, 640). A capacitor dielectric layer (not shown) can then be deposited on the capacitor electrodes, and a top electrode can then be formed on the capacitor dielectric layer, to thereby form the data storage capacitors.

According to exemplary embodiments of the present invention shown in FIGS. 3 to 6, the storage nodes of the capacitors may be variously coupled to respective storage node pads. For example, as shown in FIG. 3, two sets of storage nodes 340r and 340d are coupled by one storage node 440 replaces the two sets of storage nodes coupled to one storage node pad 345. As shown in FIG. 5, one storage node 540 is coupled to two storage node pads 545d, 545r.

FIG. 7 illustrates a portion of an integrated circuit 700 according to an exemplary embodiment of the invention. The integrated circuit 700 includes a semiconductor memory device having a first memory cell block 10a implemented by any of memory cell designs illustrated in FIG. 2a, 2b, 3, 4, 5, or 6, formed at an edge of a memory region and an adjacent second memory cell block 20a, sharing a plurality of sense amplifiers (S/A) 65 but not formed at the edge of the memory region. A third memory block (not shown) is formed on the side of memory block 20a opposing edge memory block 10a and, memory block 20a and the third memory block respectively share a second sense amplifier unit located there between.

The sense amplifier unit between memory cell blocks 10a and 20a includes a plurality of bit line sense amplifiers 65, an isolation transistor unit (not shown), and an equalizing and precharging unit (not shown). The isolation transistor unit (not shown) includes a plurality of isolation transistors each pair of which alternately connect (multiplex) a bit line in the memory cell block 10a and a bit line in the memory cell block 20a to one of the bit line sense amplifier 65.

In the case of sensing the data stored in the memory block 10a, the isolation transistor unit is turned OFF, and thus, the memory cell block 20a is disconnected from the bit line sense amplifier unit between memory cell blocks 10a and 20a. In the case of sensing the data stored in the memory block 20a, the isolation transistor unit is turned OFF, and thus, the memory cell block 10a is disconnected from the bit line sense amplifier unit between memory cell blocks 10a and 20a.

The memory device in the integrated circuit 700 includes a first memory cell block 10a including a first plurality of word lines (not shown), a first plurality of bit lines 230r, and a first plurality of memory cells formed on a substrate; a second memory cell block 20a, adjacent to the first memory cell block, including a second plurality of word lines (not shown), a second plurality of bit lines 230r, and a second plurality of memory cells on the substrate; and a first sense amplifier 65, positioned between the first and second memory cell blocks and connected to the first plurality of memory cells by a first one of the first plurality of bit lines 230r and connected to the second plurality of memory cells by a first one of the second plurality of bit lines 230r, configured to sense data stored in each of the first plurality of memory cells and in each of the second plurality of memory cells. The first plurality of memory cells and the second plurality of memory cells may be dynamic random access memory (DRAM) cells.

Each memory cell among the first plurality of memory cells includes a data storage capacitor having a first capacitance value, and each memory cell among the second plurality of memory cells includes a data storage capacitor having a second capacitance value. The data storage capacitor of each memory cell among the first plurality of memory cells occupies substantially more surface area on the substrate than the surface area on the substrate occupied by the data storage capacitor of each memory cell among the second plurality of memory cells, and thus the first capacitance value is substantially greater than the second capacitance value. The first capacitance value may be approximately double the second capacitance value.

Each data storage capacitor of the first plurality of memory cells may include a first stacked capacitor having the second capacitance value; a second stacked capacitor also having the second capacitance value; and a conductor connecting the first stacked capacitor in parallel with the second stacked capacitor and connecting to a vertical contact connected to the access transistor of its corresponding memory cell among the first plurality of memory cells.

Figure 8:
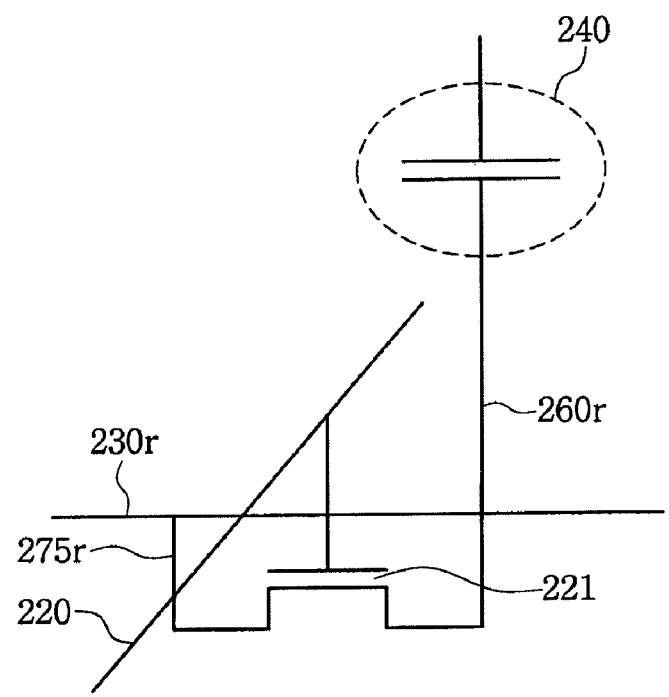
FIG. 8 is a circuit diagram of a DRAM memory cell formed in the edge-located memory cell blocks implemented by any of memory cell designs illustrated in FIG. 2a, 2b, 3, 4, 5, or 6.

FIG. 8 is a circuit diagram of a DRAM memory cell formed in the edge-located memory cell blocks implemented by any of memory cell designs illustrated in FIG. 2a, 2b, 3, 3, 4, 5, or 6. The data storage capacitor 240 corresponds to any of data storage capacitors 240a, 240b, 440, 540, 640. The access transistor having gate dielectric 221 and gate electrode 220 may be formed in active region 210r.

Figure 9:
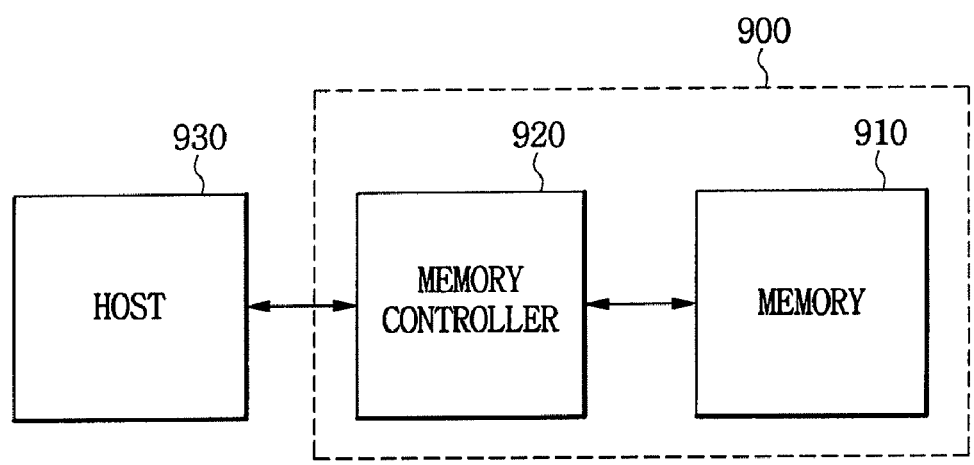
FIG. 9 is a memory system including a semiconductor device according to at least one embodiment of the present invention.

Referring to FIG. 9, a memory system including a semiconductor device according to at least one embodiment of the present invention will be described. A memory system 900 includes a memory controller 920 and a memory 910 having a varying data storage capacitor structure according to at least one embodiment of the present invention. The memory controller 920 controls the memory device 910 to read or write data from/into the memory 910 in response to a read/write request of a host 930. The memory controller 920 may include an address mapping table for mapping an address provided from the host 930 (e.g., mobile devices or computer systems) into a physical address of the memory device 910.

Figure 10:
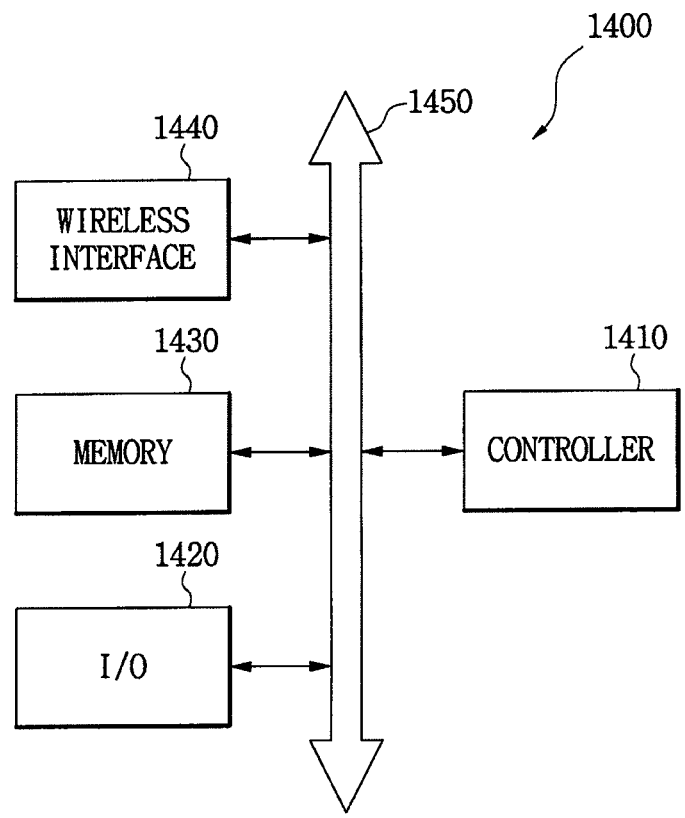
FIG. 10 is an electron device including a semiconductor device according to exemplary embodiments of the present invention.

Referring to FIG. 10, an electron device including a semiconductor device according to exemplary embodiments of the present invention will be described. The electron device 1400 may be used in a wireless communication device (e.g., a personal digital assistant, a laptop computer, a portable computer, a web tablet, a wireless telephone, a mobile phone and/or a wireless digital music player.) or in any device capable of transmitting and/or receiving information via wireless environments.

The electron device 1400 includes a controller 1410, an input/output (I/O) device 1420 (e.g., a keypad, a keyboard, and a display), a memory 1430 having a varying data storage capacitor structure according to at least one embodiment of the present invention, and a wireless interface 1440. The controller 1410 may include at least one of a microprocessor, a digital signal processor, or a similar processing device. The memory 1430 may be used to store commands executed by the controller 1410, for example. The memory 1430 may be used to store user data. The memory 1430 includes a semiconductor device according to at least one embodiment of the present invention. The electron device 1400 may utilize the wireless interface 1440 to transmit/receive data via a wireless communication network. For example, the wireless interface 1440 may include an antenna and/or a wireless transceiver. The electron device 1400 according to exemplary embodiments may be used in a communication interface protocol of a third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000.

Figure 11:
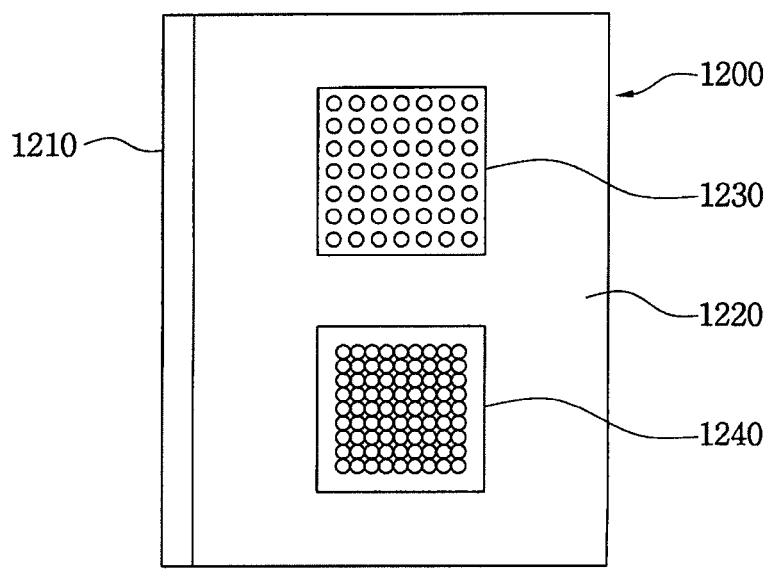
FIG. 11 is a modular memory device including a semiconductor device according to exemplary embodiments.

Referring to FIG. 11, a modular memory device including a semiconductor device according to exemplary embodiments will be described. The modular memory device 1200 may include a printed circuit board 1220. The printed circuit board 1220 may form one of the external surfaces of the modular memory device 1200. The printed circuit board 1220 may support a memory unit 1230, a device interface unit 1240, and an electrical connector 1210.

The memory unit 1230 having a varying data storage capacitor structure according to at least one embodiment of the present invention may include a three-dimensional memory array and may be connected to a memory array controller. The memory array may include the appropriate number of memory cells arranged in a three-dimensional lattice on the printed circuit board 1220. The device interface unit 1240 may be formed on a separated substrate such that the device interface unit 1240 may be electrically connected to the memory unit 1230 and the electrical connector 1210 through the printed circuit board 1220. Additionally, the memory unit 1230 and the device interface unit 1240 may be directly mounted on the printed circuit board 1220. The device interface unit 1240 may include components necessary for generating voltages, clock frequencies, and protocol logic.

While a DRAM cell having square-cylindrical capacitors or a rectangle-cylindrical stacked capacitor is described by way of example, embodiments of the present invention may be applied to semiconductor memory devices including memory cells having other switching and/or other data storage elements.

While the exemplary embodiments of the invention have been described in detail, it should be understood that various changes, substitutions and alterations may be made herein without departing from the scope of the invention.

What is claimed is:

1. A semiconductor memory device comprising:
a first memory cell block including a first plurality of word lines, a first plurality of bit lines, and a first plurality of memory cells formed on a substrate, the first plurality of memory cells being located at respective intersections of a word line of the first plurality of word lines and a bit line of the first plurality of bit lines;
a second memory cell block, adjacent to the first memory cell block, including a second plurality of word lines, a second plurality of bit lines, and a second plurality of memory cells formed on the substrate, the second plurality of memory cells being located at respective intersections of a word line of the second plurality of word lines and a bit line of the second plurality of bit lines; and
a first sense amplifier, positioned between the first and second memory cell blocks and connected to the first plurality of memory cells by a first one of the first plurality of bit lines and connected to the second plurality of memory cells by a first one of the second plurality of bit lines, configured to sense data stored in each of the first plurality of memory cells and in each of the second plurality of memory cells,
wherein each memory cell among the first plurality of memory cells includes a data storage capacitor having a first capacitance value,
wherein each memory cell among the second plurality of memory cells includes a data storage capacitor having a second capacitance value,
wherein the first capacitance value is substantially greater than the second capacitance value,
wherein each data storage capacitor of the first plurality of memory cells comprises:
a first stacked capacitor;
a second stacked capacitor; and
a conductor over a word line of a corresponding memory cell among the first plurality of memory cells, the conductor connecting to a contact connected to an access transistor of the corresponding memory cell and connecting the first stacked capacitor in parallel with the second stacked capacitor.

2. The semiconductor memory device of claim 1, wherein the data storage capacitor of each memory cell among the first plurality of memory cells occupies substantially more surface area on the substrate than the surface area on the substrate occupied by the data storage capacitor of each memory cell among the second plurality of memory cells.

3. The semiconductor memory device of claim 1, wherein the first capacitance value is approximately twice the second capacitance value.

4. The semiconductor memory device of claim 1, wherein the first memory cell block is positioned along an edge of a memory region on the substrate.

5. The semiconductor memory device of claim 4, wherein the second memory cell block is not positioned along an edge of a memory region on the substrate.

6. The semiconductor memory device of claim 1, wherein each memory cell among the first plurality of memory cells further includes an access transistor connected between a bit line and its data storage capacitor, and each access transistor is controlled by a word line.

7. The semiconductor memory device of claim 1,
wherein each memory cell among the second plurality of memory cells further includes an access transistor connected between a bit line and its data storage capacitor, and each access transistor is controlled by a word line, and
wherein two of the access transistors of the memory cells among the second plurality of memory cells are formed in one elongated active region having a long axis and a short axis perpendicular to the long axis, and two of the word lines cross each elongated active region.

8. The semiconductor memory device of claim 1, wherein the long axis of each elongated active region of memory cells among the second plurality of memory cells is diagonal relative to the direction of the two word lines that cross the elongated active region.

9. The semiconductor memory device of claim 1, wherein the first memory cell block further includes a third plurality of elongated active regions connected to a second one of the first plurality of bit lines adjacent to the first one of the first plurality of bit lines, wherein the second one of the first plurality of bit lines is not connected to any sense amplifier.

10. The semiconductor memory device of claim 1, wherein the first stacked capacitor has the second capacitance value and
the second stacked capacitor has the second capacitance value.

11. The semiconductor memory device of claim 1, wherein the first plurality of memory cells and the second plurality of memory cells are dynamic random access memory (DRAM) cells.

12. A memory device fabrication method comprising:
forming a first plurality of active regions in a first memory cell block, along an edge of a memory region,
forming a second plurality of active regions in a second memory cell block, not along the edge of the memory region,
forming a first bit line for connecting the first plurality of active regions to a first sense amplifier located between the first and second memory cell blocks,
forming a second bit line for connecting the second plurality of active regions to the first sense amplifier, and
forming a plurality of first data storage capacitors, each first data storage capacitor having a first capacitance value and being connected to one respective memory cell among the first plurality of memory cells;

forming a plurality of second data storage capacitors, each second data storage capacitor having a second capacitance value and being connected to one respective memory cell among the second plurality of memory cells;

wherein the first capacitance value is greater than the second capacitance value, and wherein each first data storage capacitor comprises:
a first stacked capacitor;
a second stacked capacitor; and
a conductor over a word line of a corresponding one respective memory cell among the first plurality of memory cells, the conductor connecting to a contact connected to an access transistor of the corresponding memory cell and connecting the first stacked capacitor in parallel with the second stacked capacitor.

13. The method of claim 12, wherein the first capacitance value is approximately equal to the sum of the second capacitance value of the second data storage capacitor plus the second capacitance value of the third data storage capacitor.

14. The method of claim 12, wherein each memory cell among the first plurality of memory cells and among the second plurality of memory cells are dynamic random access memory (DRAM) cells.

15. The method of claim 12, further comprising forming a second plurality of word lines perpendicular to the second bit line,
wherein the first word line among the second plurality of word lines is a gate electrode of an access transistor of a first memory cell connected to the second bit line, and
wherein the second word line among the second plurality of word lines, adjacent to the first word line among the second plurality of word lines, is a gate electrode of an access transistor of a second memory cell connected to the second bit line,
wherein the access transistor of the first memory cell connected to the second bit line and the access transistor of the second memory cell connected to the second bit line are formed within the same active region in second memory cell block.

16. The method of claim 15,
wherein each of the second plurality of active regions formed in second memory cell block has a major axis and a minor axis,
wherein the major axis is diagonal relative to the first word line among the second plurality of word lines.

17. The method of claim 15, further comprising forming a first plurality of word lines perpendicular to the first bit line,
wherein the first word line among the first plurality of word lines is a gate electrode of an access transistor of a first memory cell connected to the first bit line, and
wherein the second word line among the first plurality of word lines, adjacent to the first word line among the first plurality of word lines, is a gate electrode of an access transistor of a second memory cell connected to the first bit line,
wherein the access transistor of the first memory cell connected to the first bit line and the access transistor of the second memory cell connected to the first bit line are formed within the same active region in first memory cell block.

18. The method of claim 16,
wherein each of the first plurality of active regions formed in first memory cell block has a major axis and a minor axis,
wherein the major axis is diagonal relative to the first word line among the first plurality of word lines.

19. A semiconductor memory card, comprising:
a memory controller and a memory device, the memory controller controls the memory device to read or write data from/to the memory in response to a read/write request of a host,
wherein the memory device comprises:
a first memory cell block including a first plurality of word lines, a first plurality of bit lines, and a first plurality of memory cells formed on a substrate, the first plurality of memory cells being located at respective intersections of a word line of the first plurality of word lines and a bit line of the first plurality of bit lines;
a second memory cell block, adjacent to the first memory cell block, including a second plurality of word lines, a second plurality of bit lines, and a second plurality of memory cells formed on the substrate, the second plurality of memory cells being located at respective intersections of a word line of the second plurality of word lines and a bit line of the second plurality of bit lines; and
a first sense amplifier, positioned between the first and second memory cell blocks and connected to the first plurality of memory cells by a first one of the first plurality of bit lines and connected to the second plurality of memory cells by a first one of the second plurality of bit lines, configured to sense data stored in each of the first plurality of memory cells and in each of the second plurality of memory cells,
wherein each memory cell among the first plurality of memory cells includes a data storage capacitor having a first capacitance value, and
wherein each memory cell among the second plurality of memory cells includes a data storage capacitor having a second capacitance value,
wherein the first capacitance value is substantially greater than the second capacitance value,
wherein each data storage capacitor of the first plurality of memory cells comprises:
a first stacked capacitor;
a second stacked capacitor; and
a conductor over a word line of a corresponding memory cell among the first plurality of memory cells, the conductor connecting to a contact connected to an access transistor of the corresponding memory cell and connecting the first stacked capacitor in parallel with the second stacked capacitor.

20. The semiconductor memory card of claim 19, wherein the data storage capacitor of each memory cell among the first plurality of memory cells occupies substantially more surface area on the substrate than the surface area on the substrate occupied by the data storage capacitor of each memory cell among the second plurality of memory cells.

21. The semiconductor memory card of claim 19, wherein the first capacitance value is approximately twice the second capacitance value.

22. The semiconductor memory card of claim 19, wherein the host is a mobile device or a processing device having a processor.

23. The semiconductor memory card of claim 19, further including a wireless interface for communicating with a cellular device.

24. The semiconductor memory card of claim 19, further including a connector for removably connecting to a host system, wherein the host system is one of a personal computer, notebook computer, hand held computing device, camera, or audio reproducing device.

25. The semiconductor memory card of claim 19, wherein each memory cell among the first plurality of memory cells and among the second plurality of memory cells are dynamic random access memory (DRAM) cells.

26. An electronic device comprising:
a controller having a processor;
an input/output (I/O) device; and
a memory device and a wireless interface,
wherein the I/O device includes a display, wherein the wireless interface transmits or receives data via a wireless communication network, and
wherein the memory device comprises:
a first memory cell block including a first plurality of word lines, a first plurality of bit lines, and a first plurality of memory cells formed on a substrate at respective intersections of a word line of the first plurality of word lines and a bit line of the first plurality of bit lines;
a second memory cell block, adjacent to the first memory cell block, including a second plurality of word lines, a second plurality of bit lines, and a second plurality of memory cells formed on the substrate at respective intersection of a word line of the second plurality of word lines and a bit line of the second plurality of bit lines; and
a first sense amplifier, positioned between the first and second memory cell blocks and connected to the first plurality of memory cells by a first one of the first plurality of bit lines and connected to the second plurality of memory cells by a first one of the second plurality of bit lines, configured to sense data stored in each of the first plurality of memory cells and in each of the second plurality of memory cells,
wherein each memory cell among the first plurality of memory cells includes a data storage capacitor having a first capacitance value, and wherein each memory cell among the second plurality of memory cells includes a data storage capacitor having a second capacitance value,
wherein the first capacitance value is substantially greater than the second capacitance value,
wherein each data storage capacitor of the first plurality of memory cells comprises:
a first stacked capacitor;
a second stacked capacitor; and
a conductor over a word line of a corresponding memory cell among the first plurality of memory cells, the conductor connecting to a contact connected to an access transistor of the corresponding memory cell and connecting the first stacked capacitor in parallel with the second stacked capacitor.

27. The semiconductor memory card of claim 26, wherein the data storage capacitor of each memory cell among the first plurality of memory cells occupies substantially more surface area on the substrate than the surface area on the substrate occupied by the data storage capacitor of each memory cell among the second plurality of memory cells.

28. The electronic device of claim 26, wherein the wireless communication network communicates in a communication interface protocol of a third generation communication system, including one of code division multiple access (CDMA), global system for mobile communications (GSM), north American digital cellular (NADC), extended-time division multiple access (E-TDMA), wide band code division multiple access (WCDMA), or CDMA2000.

* * * * *